US010145893B2

United States Patent
Nevo et al.

(10) Patent No.: US 10,145,893 B2
(45) Date of Patent: Dec. 4, 2018

(54) RESOLVING AUTOMATED TEST EQUIPMENT (ATE) TIMING CONSTRAINT VIOLATIONS

(71) Applicant: NUVOTON TECHNOLOGY CORPORATION, Hsin-chu (TW)

(72) Inventors: Josef Nevo, Haifa (IL); Alain Bismuth, Beth Rimon (IL); Ilan Margalit, Tel Aviv (IL)

(73) Assignee: NUVOTON TECHNOLOGY CORPORATION, Hsinchu (TW)

( * ) Notice: Subject to any disclaimer, the term of this patent is extended or adjusted under 35 U.S.C. 154(b) by 59 days.

(21) Appl. No.: 15/390,505

(22) Filed: Dec. 25, 2016

(65) Prior Publication Data

US 2018/0180667 A1    Jun. 28, 2018

(51) Int. Cl.
G01R 31/28    (2006.01)

(52) U.S. Cl.
CPC ..... G01R 31/2882 (2013.01); G01R 31/2834 (2013.01)

(58) Field of Classification Search
CPC .................. G01R 31/2882; G01R 31/2834
See application file for complete search history.

(56) References Cited

U.S. PATENT DOCUMENTS

| 5,974,241 | A | 10/1999 | Fusco |
|---|---|---|---|
| 6,067,652 | A | 5/2000 | Fusco |
| 6,304,837 | B1 | 10/2001 | Geiger et al. |
| 6,609,077 | B1 | 8/2003 | Brown et al. |
| 6,639,397 | B2 | 10/2003 | Roth et al. |
| 6,833,696 | B2 | 12/2004 | Sinsheimer et al. |
| 6,978,410 | B1 | 12/2005 | Parnas |
| 7,363,568 | B2 | 4/2008 | Guidry |
| 8,156,396 | B1 | 4/2012 | Gazounaud et al. |
| 2005/0057257 | A1* | 3/2005 | Fleischman ...... G01R 31/31928 324/500 |
| 2012/0210179 | A1 | 8/2012 | Xanthopoulos et al. |

(Continued)

OTHER PUBLICATIONS

UMBC Design Verification & Testing "Test Process Overview", CMPE 418, 12 pages, Sep. 13, 2004.

*Primary Examiner* — Samir W Rizk
(74) *Attorney, Agent, or Firm* — D. Kligler IP Services Ltd.

(57) ABSTRACT

A method of testing an integrated circuit device, which involves receiving, by a processor, a test definition indicating a sequence of acts to be performed by an automated test equipment in testing an integrated circuit device. The test definition includes indications of test cycles and timings of events in the cycles. The method includes scanning the received test definition, by the processor, for switch time points for which a timing of events in a first cycle immediately preceding the switch time point is different from a timing of events in a second cycle immediately following the switch time point, determining problematic switch time points for which the combined rest duration from a specific event in the first cycle to a corresponding specific event in the second cycle is shorter than a minimal switch period of the automated test equipment, changing the received test definition by extending a length of the cycles immediately preceding the determined problematic switch time points and providing the changed test definition for testing the integrated circuit device by the automated test equipment.

19 Claims, 3 Drawing Sheets

(56) References Cited

U.S. PATENT DOCUMENTS

| | | |
|---|---|---|
| 2013/0211770 A1 | 8/2013 | Dresler et al. |
| 2015/0137838 A1 | 5/2015 | Lin et al. |
| 2015/0377967 A1 | 12/2015 | Thiruvengadam et al. |
| 2016/0033574 A1 | 2/2016 | Serrer et al. |

* cited by examiner pat_name.pat:

```
PIN_PAT
RTS2_BTNIN7_PWM13, SOUT2_PWM6_CR_SOUT, PWM3_GPE45_IRDCT1, V5USBMN_SPACFG1_BI5, PWM1_CGP62, ...
SERIRQ_ESPI_ALERT, PCI_ESPI_RESET, LFRAME_ESPI_CS, PCI_CLK_ESPI_CLK, LAD3_ESPI_IO3, LAD2_ESPI_IO2, ...
...
3600_WAVE
h/H = DTP, D0, ION, DX, SX, SX, ON, OFF;
...
MAIN_PAT
pat_espi {
    *XXXbbC xAFHkKkk ......................* Super0_0 ; /* 647190.000 1014 32358 */
    ...
}
```

{402 {404 {406 412 408 400 410 pat_name.pln:

```
set_time( Super0_0 ) {
    ...
    edge( PCI_CLK_ESPI_CLK, t0+tESPI_CLKre, t0+tESPI_CLKre+tCKH, t0,,,);
    ...
}
```

RESOLVING AUTOMATED TEST EQUIPMENT (ATE) TIMING CONSTRAINT VIOLATIONS

FIELD OF THE INVENTION

The present invention relates generally to integrated circuits and specifically to methods of testing integrated circuits.

BACKGROUND

Integrated circuits are generally tested by automated test equipment (ATE) to verify that the integrated circuit actually does what it was intended to do. A designer of the integrated circuit defines an input stimulus and corresponding expected output. The ATE provides the input stimulus to a tested integrated circuit, generally referred to as a device under test (DUT), and verifies that the resulting output from the DUT is substantially the same as expected.

Current integrated circuits are very complex and operate at very high speeds. The testing is therefore very demanding and not always can available ATEs provide an input stimulus operating the DUT in the simplest workable manner.

U.S. Pat. No. 8,156,396 to Gazounaud, which is incorporated herein by reference in its entirety, describes an ATE system with increased data rate of the ATE, by delegating processing tasks to multiple test components.

U.S. Pat. No. 6,978,410 to Parnas, which is incorporated herein by reference in its entirety, describes pin multiplexing to overcome ATE constraints.

U.S. Pat. No. 6,067,652 to Fusco et al., which is incorporated herein by reference in its entirety, describes a verification module which ensures that the input, output and bidirectional signal waveform formats of a designed test, are compatible with a targeted ATE. In addition, a translation module generates tester-compatible input stimulus files.

US patent publication 2015/0137838 to Lin et al., which is incorporated herein by reference in its entirety, describes a test system with edge steering.

US patent publication 2015/0137838 to Thiruvengadam et al., which is incorporated herein by reference in its entirety, describes a system that generates a strobe signal with a triggering edge that triggers a write, and a trailing edge that is modulated by adjusting the duty cycle of the strobe signal.

SUMMARY OF THE INVENTION

Some embodiments of the present invention provide a method of testing an integrated circuit device, comprising receiving, by a processor, a test definition indicating a sequence of acts to be performed by an automated test equipment in testing an integrated circuit device, wherein the test definition includes indications of test cycles and timings of events in the cycles, scanning the received test definition, by the processor, for switch time points for which a timing of events in a first cycle immediately preceding the switch time point is different from a timing of events in a second cycle immediately following the switch time point, determining, by the processor, problematic switch time points for which the combined rest duration from a specific event in the first cycle to a corresponding specific event in the second cycle is shorter than a minimal switch period of the automated test equipment, changing the received test definition by extending a length of the cycles immediately preceding the determined problematic switch time points, and providing the changed test definition for testing the integrated circuit device by the automated test equipment.

Optionally, determining the problematic switch time points comprises determining time points for which a rest duration from a specific event in the first cycle to a same specific event in the second cycle is shorter than a minimal switch period of the automated test equipment.

Optionally, determining the problematic switch time points comprises determining time points for which a rest duration from a last event in the first cycle to a first event in the second cycle is shorter than a minimal switch period of the automated test equipment. Optionally, changing the received test definition comprises defining for a timing definition of the cycle to be extended, a corresponding alternative timing definition which differs from an original timing definition of the first cycle only in its cycle length. Optionally, the alternative timing definition is included only in the changed test definition and not in the received test definition.

Optionally, changing the received timing definition comprises extending the cycle of the first cycles by an integer multiple of an original cycle length of the first cycles. Optionally, the method includes generating a simulation test by a simulator of the integrated circuit device, and wherein receiving the test definition comprises receiving a conversion of the generated simulation test into the test definition and wherein determining the switch time points for which the combined rest duration is shorter than a minimal switch period of the automated test equipment comprises determining at least partially from the simulation test generated by the simulator, before its conversion.

Optionally, providing the changed test definition comprises providing a changed test definition including at least one cycle having a different cycle length than an immediately preceding and an immediately following cycle. Optionally, determining problematic switch time points comprises determining switch time points for which a combined rest duration from an input event in the first cycle to a corresponding input event in the second cycle is shorter than a minimal switch period of the automated test equipment.

Optionally, determining problematic switch time points comprises determining switch time points for which a combined rest duration from an sensing event in the first cycle to a corresponding sensing event in the second cycle is shorter than a minimal switch period of the automated test equipment. Optionally, the method includes counting in the provided changed test definition a number of cycles having a different cycle length than an immediately preceding and an immediately following cycle, and accordingly providing an indication on a complexity of the test. Optionally, the method includes determining for one or more of the problematic switch time points whether a value to be placed by the automated test equipment on a pin of the integrated circuit device corresponding to the problematic switch time point changes around the problematic switch time point and wherein changing the received test definition is performed only if the value to be placed on the pin changes around the problematic switch time point.

There is further provided in accordance with an embodiment of the present invention, an apparatus for testing an integrated circuit device, comprising an input interface for receiving a test definition indicating a sequence of acts to be performed by an automated test equipment in testing an integrated circuit device, wherein the test definition includes indications of test cycles and timings of events in the cycles, an output interface for providing simulation sequences to the automated test equipment and a processor configured to scan the received test definition for switch time points for which a timing of events in a first cycle immediately preceding the switch time point is different from a timing of events in a second cycle immediately following the switch time point, to determine problematic switch time points for which the combined rest duration from a specific event in the first cycle to a corresponding specific event in the second cycle is shorter than a minimal switch period of the automated test equipment, to change the received test definition by extending a length of the cycles immediately preceding the determined problematic switch time points, and to provide the changed test definition for testing the integrated circuit device through the output interface.

Optionally, the processor is configured to determine time points for which a rest duration from a specific event in the first cycle to a same specific event in the second cycle is shorter than a minimal switch period of the automated test equipment. Optionally, the processor is configured to change the received test definition by defining for a timing definition of the cycle to be extended, a corresponding alternative timing definition which differs from an original timing definition of the first cycle only in its cycle length.

Optionally, the processor is configured to receive a generated simulation test from which the test definition was generated and to determine the switch time points for which the combined rest duration is shorter than a minimal switch period of the automated test equipment at least partially from the received generated simulation test.

Optionally, the processor is configured to provide the changed test definition with at least one cycle having a different cycle length than an immediately preceding and an immediately following cycle. Optionally, the processor is configured to determine problematic switch time points for which a combined rest duration from an input event and/or a sensing event in the first cycle to a corresponding input event in the second cycle is shorter than a minimal switch period of the automated test equipment.

BRIEF DESCRIPTION OF THE FIGURES

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings:

FIG. 4 is a general example of a pattern structure of test sequences to be used in explaining an embodiment of the present invention.

DESCRIPTION OF THE PREFERRED EMBODIMENTS

An aspect of some embodiments of the present invention relates to automatic scanning of test sequences and accompanying test definitions for an automated test equipment (ATE). The scanning identifies problematic switching time points between cycles of the test definition, which have a rest time shorter than a minimal switch period required by the specifications of the ATE between input and/or output events. For the identified problematic switching time points, the test definitions are changed to extend the cycle before the problematic switching time point, optionally without extending previous and/or subsequent cycles. By extending the cycle, the tests represented by the definitions and sequences can be more accurately carried out by the ATE, without forcing the ATE to skip execution of an event or requiring that a user manually identify the problems and improvise solutions so the tests can be carried out in their entirety.

Figure 1:
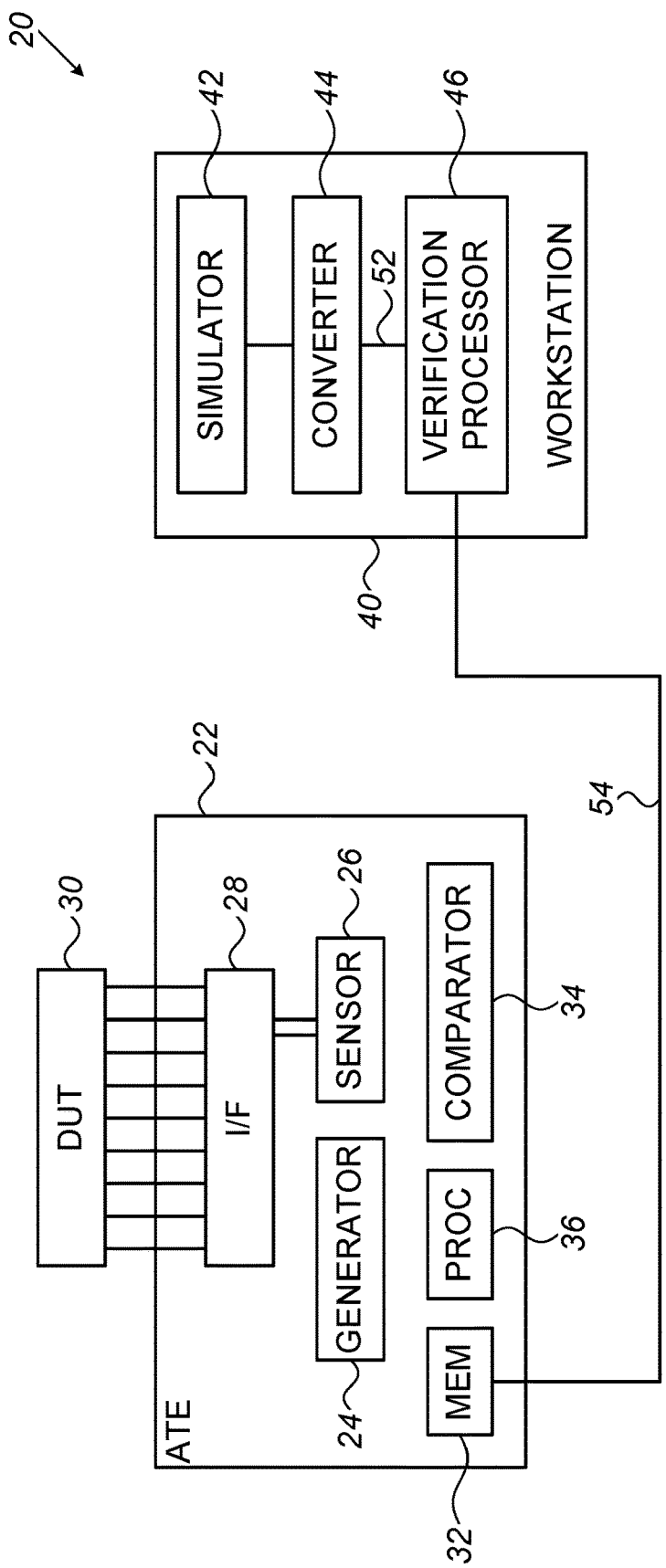
FIG. 1 is a schematic illustration of an integrated circuit test system, in accordance with an embodiment of the invention.

FIG. 1 is a schematic illustration of an integrated circuit test system 20 including a verification processor, in accordance with an embodiment of the invention. System 20 comprises an automated test equipment (ATE) 22, which includes a signal generator 24 and a signal sensor 26. An integrated circuit interface 28 is configured to couple a device under test (DUT) 30 to signal generator 24 and signal sensor 26. In operation, signal generator 24 provides DUT 30 with a predetermined sequence of test input signals and signal sensor 26 senses output signals from DUT 30 resulting from the sequence of test input signals, in accordance with a predetermined test definition. The test definition, as discussed in more detail below defines a test sequence stating the acts to be performed by ATE 22 for a sequence of clock cycles of the test. A memory 32 optionally stores test definitions including sequences of test input signals and the corresponding expected output signals. A comparator 34 optionally compares the actual output sensed by signal sensor 26 to the expected output, and accordingly verifies proper operation of DUT 30. In some embodiments of the invention, comparator 34 provides an indication as to whether the DUT was verified. Optionally, ATE 22 comprises a processor 36, which controls the other elements of ATE 22 and performs tasks of the ATE. In some embodiments of the invention, one or more of generator 24, sensor 26 and/or comparator 34 are implemented in software on processor 36. Alternatively, generator 24, sensor 26 and/or comparator 34 are implemented in dedicated hardware circuits.

The test definitions and sequences in memory 32 are optionally generated by designers of DUT 30, for example on a workstation 40. In some embodiments of the invention, a simulator 42 used to generate the DUT 30, generates corresponding simulation tests to be carried out on the DUT. The simulation tests may be in any suitable simulation test format, such as the value change dump (VCD) format. Optionally, a converter 44 converts the simulation tests from the simulator output into test sequences and associated test definitions in a format accepted and recognized by ATE 22. Simulator 42 and converter 44 may be located on workstation 40 or may be located on any other computer.

Optionally, the test sequences and definitions received from workstation 40 are passed, for example through an input interface 52, to a verification processor 46, which checks that the test sequences and definitions are in accordance with the capabilities of signal generator 24 and/or sensor 26. When test input signals cannot be generated by signal generator 24 and/or sensor 26 cannot carry out one or more sensing events prescribed by a test definition, verification processor 42 optionally changes the test definition so that its events can be carried out by ATE 22, without substantially changing the test defined by the test sequence and definition. The changed test sequence and associated test definition is provided to ATE 22, for example to memory 32, through an output interface 54 of verification processor 46.

In the following description, the term "waveform" is used to describe a set of events to be carried out regarding the interaction of ATE 22 with a single pin of DUT 30, during a single cycle of the test defined by the test definition.

Figure 2:
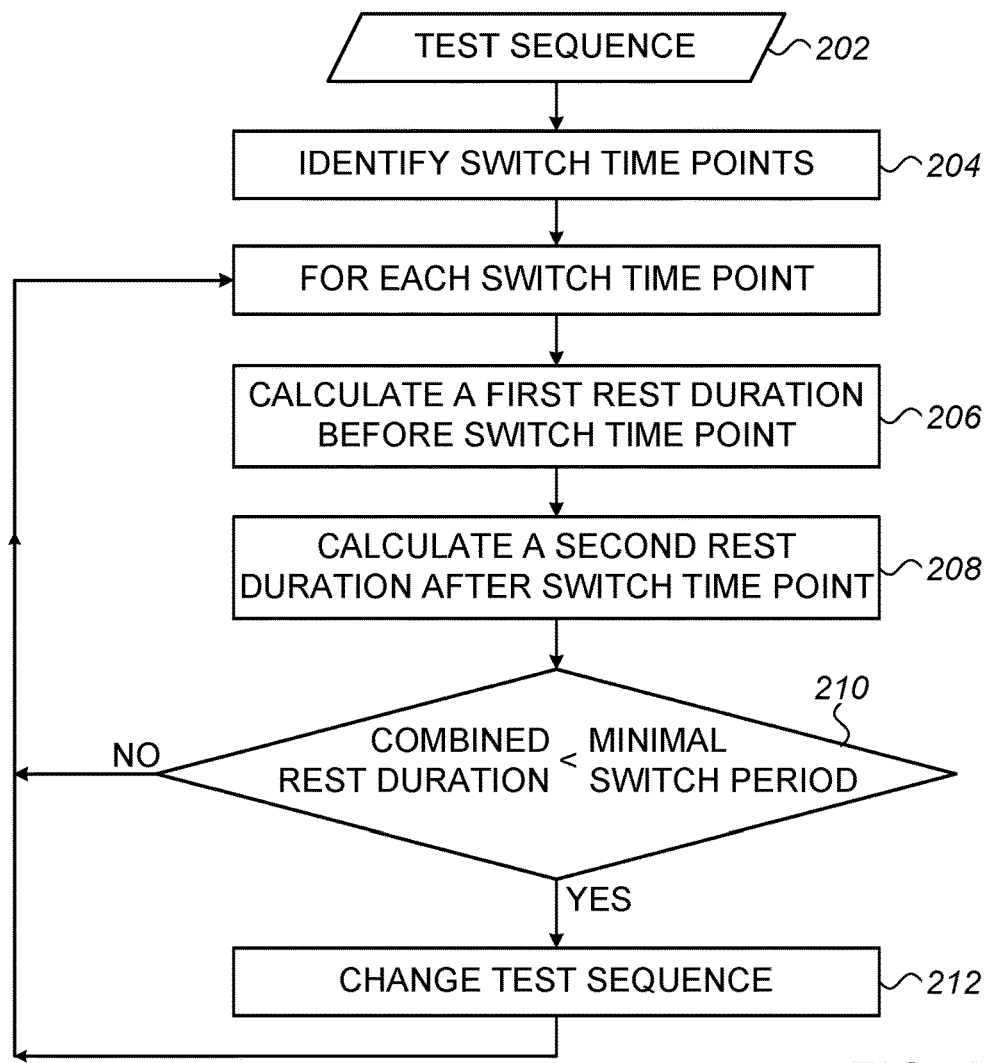
FIG. 2 is a flowchart of acts performed in handling ATE specification timing violations in test sequences, in accordance with an embodiment of the invention.

FIG. 2 is a flowchart of acts performed in identification of ATE specification timing violations in test sequences and definitions, in accordance with an embodiment of the invention. Verification processor 46 receives (202) a test sequence accompanied by a definition and for each pin of DUT 30 identifies (204) time points at which an event waveform of the pin switches from a first waveform in a first cycle immediately preceding the time point, to a second, different, waveform in a second, subsequent, cycle, immediately following the time point. For each identified switch time point, verification processor 46 optionally calculates (206) a first rest duration between an event in the first waveform and the end of the first cycle. In addition, verification processor 46 calculates (208) a second rest duration from the beginning of the second cycle to a corresponding event in the second, subsequent, cycle. The combined length of the first and second rest durations is compared (210) to a minimal switch period of ATE 22. If the combined rest duration is shorter than the minimal switch period of ATE 22, the received test sequence is changed (212) by extending the first cycle by an extent sufficient to bring the combined rest duration to be above the minimal switch period of ATE 22.

Although the change (212) in the first cycle extends the length of the test, applicant has determined that the number of extensions required is generally sufficiently small, so as not to substantially alter the length of a testing session of ATE 22. In addition, although it is undesirable to make any changes in a test sequence and accompanying test definition received from an operator or a simulator, applicant has determined that changing the length of cycles at points at which the waveform on the pin switches is not material and can be performed without degrading the quality of the test.

Figure 3:
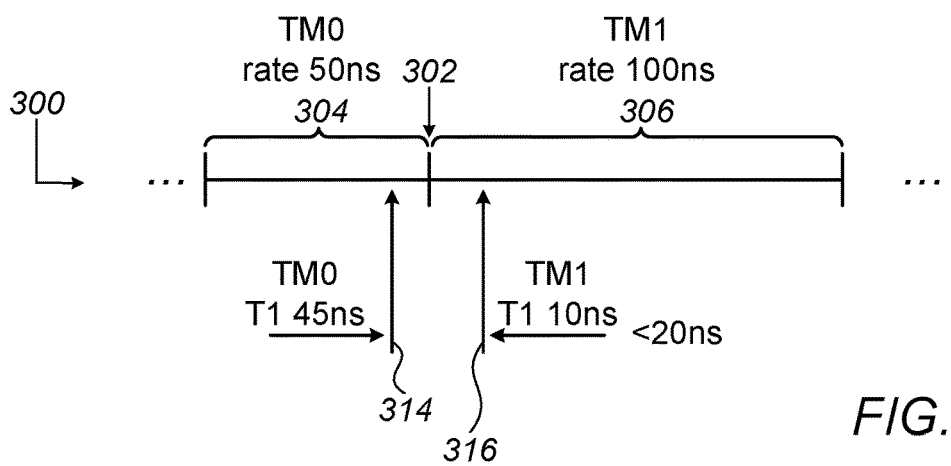
FIG. 3 is a schematic time graph illustration of an ATE specification timing violation, in accordance with an embodiment of the invention.

FIG. 3 is a schematic time graph illustration of an ATE specification timing violation, identified in accordance with an embodiment of the invention. In a time line 300 of events prescribed by a test sequence to be provided to a specific input pin during an ATE test, verification processor 46 identifies a time point 302 in which the signals switch from a first cycle defined to have a waveform TM0 to a second cycle defined to have a second waveform TM1. FIG. 3 shows a single first cycle 304 of the first waveform TM0 and a single second cycle 306 of the second waveform TM1. As shown, the first cycle has a period of 50 ns and the second cycle has a period of 100 ns. It is noted, however, that the first and second cycles do not necessarily have different cycle periods and in some cases they have the same cycle period, but different event times within the cycles. A relevant event 314 of the first waveform TM0 occurs 45 ns after the beginning of its cycle 304, such that a first rest duration of 5 ns remains between the relevant event 314 and the end of cycle 304 of the first waveform TM0. A corresponding event 316 of the second waveform TM1 occurs 10 ns after the beginning of second cycle 306. Accordingly, the combined rest duration between events 314 and 316 is 15 ns. If the ATE specification requires at least 20 ns between two events on time line 300, a violation of the ATE specification is identified at time point 302.

In accordance with some embodiments of the present invention, verification processor 46 changes the test definition by increasing the cycle period of first cycle 304. The cycle period is extended by at least 5 ns, so that the combined time period between events 314 and 316 meets the ATE specification. The cycle period extension extends the entire test for all the pins of DUT 30 by the time of the extension, e.g., 5 ns, but applicant has determined that the number of time extensions is limited and therefore the extension of the tests would not be meaningful. In addition, due to the switch between two waveforms TM0 and TM1 this extension does not substantially degrade the quality of the test.

FIG. 4 is a general example of a pattern structure 400 of test definitions and sequences to be used in explaining an embodiment of the present invention. Pattern structure 400 includes a first file 410 which defines the names of the pins of the DUT 30 in a first section 402 titled pin_pat. The first file 410 further defines different types of waveforms in a second section 404, titled 3600_WAVE. Generally, each type of waveform is represented by an upper case or lower case letter. In FIG. 4, only a definition for a single waveform, whose clock pulsing is represented by the letter H is shown. In a third section 406, a sequence of lines 408 formed of test vectors constructing the test sequence and corresponding timing definitions is provided.

Each line 408 in the third section 406 represents one or more clock cycles, which are carried out following the previous line. Each line 408 includes on the left a sequence of characters, referred to herein as a test vector, including a single letter corresponding to each of the pins of DUT 30, indicating the waveform of the pin for the clock cycle of the line 408. On the right, each line gives a timing definition name 412 (e.g., Super0_0), which corresponds to the timing of different events within the waveform, in the one or more clock cycles of the line. A second file 420 includes timing information for the timing definition names. In FIG. 4, timing for only a single pin, of a single timing definition name is shown. It is noted, however, that each timing definition name optionally has definitions for each of the pins, and each timing definition name has a separate set of pin definitions.

In the example of FIG. 4 and Table 2 below, six events are defined for each waveform, and hence, each timing definition includes six time points corresponding respectively to the six events. The events optionally include changes of the interaction of ATE 22 with the corresponding pin, such as connecting to the pin, disconnecting from the pin, and/or changes (e.g., transitions) in the electrical value applied to the pin. In one embodiment, the events include both input and sensing events, for example four input events and two sensing (or output) events. For example, in a possible embodiment, the event times include a time at which to begin pushing a signal change, a time at which to end pushing the signal change, a time at which the signal is pushed to zero and a time at which the signal is pushed to one. The two sensing events optionally include times to begin and end sensing.

The times given in Table 2 indicate the time after the beginning of a current cycle at which the corresponding event occurs. Generally, each pin has its own waveform definitions and timing, although some pins may share waveform definitions and/or timings. As an example, a sequence of lines 408 is shown in Table 1. A corresponding set of timing definitions is presented in Table 2. It is noted that, for brevity, Table 2 only shows lines of the edge( ) function for one or two pins of the DUT 30, although separate edge( ) function lines may be included for each of the pins, for each of the time definitions (e.g., super0_0).

TABLE 1

| *xxxxxxxx | bCCxDA | Exxxx | xaxxaaaxA* | Super0_0 ; /* 167 */ |
|---|---|---|---|---|
| *xxxxxxxx | bCCxDA | Exxxx | xaxxAAAxa* | Super0_0 ; /* 168 */ |
| *xxxxxxxx | bCCxDA | Exxxx | xaxxFFfxl* | Super0_1 ; /* 169 */ |
| *xxxxxxxx | bCCxDA | Exxxx | xaxxfffxl* | Super0_1 ; /* 170 */ |
| *xxxxxxxx | bCCxDA | Exxxx | xaxxFFFxL* | Super0_1 ; /* 171 */ |
| *xxxxxxxx | bCCxDA | Exxxx | xAxxAAAxA* | Super0_0 rept 6 ; /* 172 */ |

TABLE 2

```
set_time (Super0_0) {rate (20nS );
   edge (PVT_DIO3, 20nS, 30.8nS,
   10.45nS, 31.7nS, 15nS, 42.4nS ); ...
   edge (LFRAME_ESPI_CS, 20nS, 30nS,
   10.45nS, 22.7nS, 12nS, 14nS ); ...
}
set_time( Super0_1 ) {rate (20nS );
   edge( PVT_DIO3, 20nS, 30.8nS,
   11nS, 31.7nS, 10nS, 42.4nS ); }
set_time( Super0_2 ) {rate (20nS );
   edge( PVT_DIO3, 42.2nS, 30.8nS,
   51.8nS, 31.7nS, 49.8nS, 42.4nS ); }
```

The identifying (204) of switch time points is optionally performed on test sequences of the format of FIG. 4 and Tables 1 and 2 by reviewing the lines 408 of section 406 to identify lines in which the timing definition is different from the previous and/or the subsequent line. In the sequence of clock cycles shown in Table 1 there are two timing definition switches, from timing definition Super0_0 to timing definition Super0_1 (between lines 168-169) and back to timing definition Super0_0 (between lines 171-172).

For the signal of each pin, verification processor 46 optionally calculates (206) the first rest duration by finding in the corresponding timing definition of the first line involved in the switch (for line 168, timing definition Super0_0), the time of a relevant event and calculating the time from the event to the end of the signal cycle. For example, for the fifth event out of the six provided in the example of table 2, the stated time for pin PVT_DIO3 in timing definition Super0_0 is 15 ns. The time of the fifth event is compared to the cycle length, designated "rate", which for timing definition Super0_0 is 20 ns, resulting in a first rest time of 5 ns.

Verification processor 46 optionally calculates (208) the second rest duration as the time from the switch time point to the corresponding event, e.g., the fifth event, in the timing definition of the second line involved in the switch (for line 169, timing definition Super0_1), which is 10 ns. The combined rest duration in the example of lines 168-169 is 15 ns. If the minimal switch period of ATE 22 is 20 ns, the comparison (210) identifies a problem.

The events for which the comparison (210) is performed depend on the constraints of ATE 22. In some embodiments, verification processor 46 checks for each event that the difference between the time of the event in the first cycle and the time of the event in the subsequent cycle is not shorter than the minimal switch period. The minimal switch period may be the same for all the events, or may be different for different events. In other embodiments, verification processor 46 checks for a sufficient rest period only for a subset of the events. Further alternatively or additionally, comparison (210) compares a rest time between a last event in the first cycle of the switch and the first event of the second cycle of the switch. It is noted that in some cases, the last event occurs after the end of the cycle and thus the first rest duration is negative. In still other embodiments, each pin is determined to be in an input, output or input/output mode and the comparison is performed for the events relevant to the mode of the pin. For example, pins that are in an input mode are verified for input events, in which ATE 22 drives pins of the DUT 30. Pins in an output mode are verified for output events, in which ATE 22 senses values on the pins that were driven by DUT 30. The specifications of ATE 22 may require the same minimal switch period for input and output events or may have different minimal switch periods for input and output events. Furthermore, different input events or different output events may have different minimal switch periods.

The comparison (210) is optionally repeated for each pin of the DUT 30 and for each switch of timing definition. Alternatively, the comparison (210) is performed only for a sub-group of the pins of DUT 30, for example excluding pins known not to have waveform switches.

In changing (212) the sequence, verification processor 46 optionally replaces the timing definition indicated by the first line involved in the switch, e.g., line 168, to a newly defined timing definition, e.g., Super0_10. Similarly, if the switch between lines 171 and 172 is determined to violate the timing constraints of ATE 22, verification processor 46 changes timing definition Super0_1 of line 171 to a newly defined timing definition, e.g., Super0_11. The changed lines of Table 1 are shown in Table 3.

TABLE 3

| *xxxxxxxx | bCCxDA | Exxxx | xaxxaaaxA* | Super0_0 ; /* 167 */ |
|---|---|---|---|---|
| *xxxxxxxx | bCCxDA | Exxxx | xaxxAAAxa* | Super0_10 ; /* 168 */ |
| *xxxxxxxx | bCCxDA | Exxxx | xaxxEFfxl* | Super0_1 ; /* 169 */ |
| *xxxxxxxx | bCCxDA | Exxxx | xaxxfffxl* | Super0_1 ; /* 170 */ |
| *xxxxxxxx | bCCxDA | Exxxx | xaxxFFFxL* | Super0_11 ; /* 171 */ |
| *xxxxxxxx | bCCxDA | Exxxx | xAxxAAAxA* | Super0_0 rept 6 ; /* 172 */ |

The newly created timing definitions Super0_10 and Super0_11 are basically identical to the respective original timing definitions Super0_0 and Super0_1, but differ in the cycle time being extended. For example, Table 4 shows five timing definitions, including the three original timing definitions generated with the test sequence by workstation 40, and timing definitions Super0_10 and Super0_11, referred to herein as "alternative timing definitions", which are generated by verification processor 46.

TABLE 4

```
set_time( Super0_0 ) { rate (20nS );
   edge( PVT_DIO3, 20nS, 30.8nS,
   10.45nS, 31.7nS, 15nS, 42.4nS );
   edge (LFRAME_ESPI_CS, 20nS, 30nS,
   10.45nS, 22.7nS, 12nS, 14nS ); ...}
set_time( Super0_10 ) {rate (2 * 20nS );
   edge( PVT_DIO3, 20nS, 30.8nS,
   10.45nS, 31.7nS, 15nS, 42.4nS );
   edge (LFRAME_ESPI_CS, 20nS, 30nS,
   10.45nS, 22.7nS, 12nS, 14nS ); ...}
set_time( Super0_1 ) { rate (20nS );
   edge( PVT_DIO3, 20nS, 30.8nS,
   11nS, 31.7nS, 10nS, 42.4nS ); }
set_time( Super0_11 ) { rate (2 * 20nS );
   edge( PVT_DIO3, 20nS, 30.8nS,
```

TABLE 4-continued

```
            11nS, 31.7nS, 10nS, 42.4nS ); }
    set_time( Super0_2 ) {rate (20nS );
         edge( PVT_DIO3, 42.2nS, 30.8nS,
            51.8nS, 31.7nS, 49.8nS, 42.4nS ); }
```

As can be seen in Table 4, timing definition Super0_10 differs from timing definition Super0_0 only in its cycle length, referred to as "rate".

The extended cycle length is optionally selected according to the time of the combined rest duration. Assuming a minimal switch period of ATE 22 of 20 ns, the cycle length of Super0_10 needs to be extended at least to 10 ns=20 ns–10 ns after the fifth event of Super0_0, e.g., 15 ns, which is to 25 ns. In the embodiment of Table 3, the extended cycle length is selected in multiples of the original rate, as 3*20 ns. In other embodiments, the minimal possible extended cycle length, e.g., 25 ns, is used. In other embodiments, the shortest possible cycle length rounded to a specific value, e.g., closest nanosecond or 10 ns, is used. In still other embodiments, a predetermined extended cycle length, which is expected to be sufficient in all cases, e.g., 100 ns, is used.

In some embodiments, each time verification processor 46 needs to extend a cycle of a timing definition, a new timing definition name (e.g., Super0_10) is defined. Alternatively, verification processor 46 scans previous defined timing definition name to determine whether they can be used again. Optionally, in some cases, verification processor 46 extends the extended cycle of previously defined timing definition name, to allow their repeated use in cases which require a longer cycle to meet the minimal switch period of ATE 22.

The resulting test sequence includes changes in the cycle length which last for only a single cycle, after which the cycle length is changed again. In some cases, the change includes reverting back to the original clock cycle that was effective before the switching time point. This generally does not occur in test sequences generated by simulators known in the art. Thus, a test sequence provided to an ATE 22, after being changed by verification processor 46, can generally be identified by the occurrence of changes in the clock rate, which last for only a single cycle. In some embodiments, the extent to which a test sequence required changing can be evaluated by counting the number or percentage of occurrences of clock rate changes lasting only a single cycle.

In the above description, the determination that the received test sequence is to be changed (212) is performed irrespective of the actual values to be placed by ATE 22 on the pin, in accordance with the test sequence. In other embodiments, however, after determining that the combined rest duration is smaller than the minimal switch period, verification processor 46 checks to determine whether the value placed on the relevant pin, by ATE 22, actually changes at the identified switch time point. In these other embodiments, only if the value on to be placed by ATE 22 on the pin actually changes around the identified switching time point having a short rest duration, is the test definition changed. Absent any such value changes, the short timing is not considered a problem in these embodiments and the test definition is not changed.

In other embodiments, test sequence changes (212) are applied at more switch points, based on more lenient tests. For example, instead of changing (212) the test sequence only where the rest duration is shorter than a minimal switch period of ATE 22, the changing of the test sequence is performed anywhere where the rest duration is not shorter than the minimal switch period of ATE 22 by at least a safety margin (e.g., 1 ns or 5 ns). Furthermore, in some embodiments, verification processor 46 does not check the rest duration at all, but rather, anywhere there is a switch time point between two different signal definitions, the cycle duration of the first signal definition is extended sufficiently to avoid switch duration problems.

While the above description relates to a specific test signal format, the person of the art will readily be able to implement the acts of FIG. 2 on other test sequence formats. Alternatively to identifying the switch points requiring changes in the test sequences, the switch points requiring changes are identified in the simulator output (e.g., the VCD format). Verification processor 46 may be separate from the converter 44 or may be provided as an integral part thereof, in hardware, software and/or firmware.

End Remarks

It will be appreciated that the above described description of methods and apparatus are to be interpreted as including apparatus for carrying out the methods and methods of using the apparatus. It should be understood that, where appropriate, features and/or steps described with respect to one embodiment may be used with other embodiments and that not all embodiments of the invention have all of the features and/or steps shown in a particular figure or described with respect to a specific embodiment.

It is noted that at least some of the above described embodiments may include non-limiting details which were provided by way of example for illustration purposes and/or to describe the best mode contemplated by the inventors and therefore may include structure, acts or details of structures and acts that are not essential to the invention. Structure and acts described herein are replaceable by equivalents known in the art, which perform the same function, even if the structure or acts are different. Many alternative implementation details may be used. Therefore, the scope of the invention is limited only by the elements and limitations as used in the claims, wherein the terms "comprise," "include," "have" and their conjugates, shall mean, when used in the claims, "including but not necessarily limited to."

The invention claimed is:

1. A method of testing an integrated circuit device, comprising:
   receiving, by a processor, a test definition indicating a sequence of acts to be performed by an automated test equipment in testing an integrated circuit device, wherein the test definition includes indications of test cycles and timings of events in the cycles;
   scanning the received test definition, by the processor, for switch time points for which a timing of events in a first cycle immediately preceding the switch time point is different from a timing of events in a second cycle immediately following the switch time point;
   determining, by the processor, problematic switch time points for which the combined rest duration from a specific event in the first cycle to a corresponding specific event in the second cycle is shorter than a minimal switch period of the automated test equipment;
   changing the received test definition by extending a length of the cycles immediately preceding the determined problematic switch time points; and
   providing the changed test definition for testing the integrated circuit device by the automated test equipment.

2. The method of claim 1, wherein determining problematic switch time points comprises determining time points for which a rest duration from a specific event in the first cycle to a same specific event in the second cycle is shorter than a minimal switch period of the automated test equipment.

3. The method of claim 1, wherein determining the problematic switch time points comprises determining time points for which a rest duration from a last event in the first cycle to a first event in the second cycle is shorter than a minimal switch period of the automated test equipment.

4. The method of claim 1, wherein changing the received test definition comprises defining for a timing definition of the cycle to be extended, a corresponding alternative timing definition which differs from an original timing definition of the first cycle only in its cycle length.

5. The method of claim 4, wherein the alternative timing definition is included only in the changed test definition and not in the received test definition.

6. The method of claim 1, wherein changing the received timing definition comprises extending the cycle length of the first cycles by an integer multiple of an original cycle length of the first cycles.

7. The method of claim 1, further comprising generating a simulation test by a simulator of the integrated circuit device, and wherein receiving the test definition comprises receiving a conversion of the generated simulation test into the test definition and wherein determining the switch time points for which the combined rest duration is shorter than a minimal switch period of the automated test equipment comprises determining at least partially from the simulation test generated by the simulator, before its conversion.

8. The method of claim 1, wherein providing the changed test definition comprises providing a changed test definition including at least one cycle having a different cycle length than an immediately preceding and an immediately following cycle.

9. The method of claim 1, wherein determining problematic switch time points comprises determining switch time points for which a combined rest duration from an input event in the first cycle to a corresponding input event in the second cycle is shorter than a minimal switch period of the automated test equipment.

10. The method of claim 1, wherein determining problematic switch time points comprises determining switch time points for which a combined rest duration from a sensing event in the first cycle to a corresponding sensing event in the second cycle is shorter than a minimal switch period of the automated test equipment.

11. The method of claim 1, further comprising counting in the provided changed test definition a number of cycles having a different cycle length than an immediately preceding and an immediately following cycle, and accordingly providing an indication on a complexity of the test.

12. The method of claim 1, comprising determining for one or more of the problematic switch time points whether a value to be placed by the automated test equipment on a pin of the integrated circuit device corresponding to the problematic switch time point changes around the problematic switch time point and wherein changing the received test definition is performed only if the value to be placed on the pin changes around the problematic switch time point.

13. Apparatus for testing an integrated circuit device, comprising:
an input interface for receiving a test definition indicating a sequence of acts to be performed by an automated test equipment in testing an integrated circuit device, wherein the test definition includes indications of test cycles and timings of events in the cycles;
an output interface for providing simulation sequences to the automated test equipment; and
a processor configured to scan the received test definition for switch time points for which a timing of events in a first cycle immediately preceding the switch time point is different from a timing of events in a second cycle immediately following the switch time point, to determine problematic switch time points for which the combined rest duration from a specific event in the first cycle to a corresponding specific event in the second cycle is shorter than a minimal switch period of the automated test equipment, to change the received test definition by extending a length of the cycles immediately preceding the determined problematic switch time points, and to provide the changed test definition for testing the integrated circuit device through the output interface.

14. The apparatus of claim 13, wherein the processor is configured to determine time points for which a rest duration from a specific event in the first cycle to a same specific event in the second cycle is shorter than a minimal switch period of the automated test equipment.

15. The apparatus of claim 13, wherein the processor is configured to change the received test definition by defining for a timing definition of the cycle to be extended, a corresponding alternative timing definition which differs from an original timing definition of the first cycle only in its cycle length.

16. The apparatus of claim 13, wherein the processor is configured to receive a generated simulation test from which the test definition was generated and to determine the switch time points for which the combined rest duration is shorter than a minimal switch period of the automated test equipment at least partially from the received generated simulation test.

17. The apparatus of claim 13, wherein the processor is configured to provide the changed test definition with at least one cycle having a different cycle length than an immediately preceding and an immediately following cycle.

18. The apparatus of claim 13, wherein the processor is configured to determine problematic switch time points for which a combined rest duration from an input event in the first cycle to a corresponding input event in the second cycle is shorter than a minimal switch period of the automated test equipment.

19. The apparatus of claim 13, wherein the processor is configured to determine problematic switch time points for which a combined rest duration from a sensing event in the first cycle to a corresponding sensing event in the second cycle is shorter than a minimal switch period of the automated test equipment.

* * * * *